(12) United States Patent
Motoichi et al.

(10) Patent No.: US 8,035,355 B2
(45) Date of Patent: Oct. 11, 2011

(54) CHARGE-CONTROLLING SEMICONDUCTOR INTEGRATED CIRCUIT

(75) Inventors: Yoshihiro Motoichi, Atsugi (JP); Daisuke Suzuki, Atsugi (JP); Yoshihiro Takahashi, Atsugi (JP); Gentaro Kurokawa, Atsugi (JP)

(73) Assignee: Mitsumi Electric Co., Ltd., Tama-Shi (JP)

( * ) Notice: Subject to any disclaimer, the term of this patent is extended or adjusted under 35 U.S.C. 154(b) by 313 days.

(21) Appl. No.: 12/478,065

(22) Filed: Jun. 4, 2009

(65) Prior Publication Data
US 2009/0302805 A1 Dec. 10, 2009

(30) Foreign Application Priority Data
Jun. 6, 2008 (JP) ................... 2008-149032

(51) Int. Cl.
*H02J 7/16* (2006.01)
*H02J 7/24* (2006.01)
(52) U.S. Cl. ......... 320/164; 320/157; 320/158; 320/159
(58) Field of Classification Search .................. 320/164, 320/157, 158, 159
See application file for complete search history.

(56) References Cited

U.S. PATENT DOCUMENTS

| | | | |
|---|---|---|---|
| 5,835,361 A * | 11/1998 | Fitzgerald | 363/21.03 |
| 6,377,381 B1 | 4/2002 | Matsuo | |
| 6,407,532 B1 | 6/2002 | Ruha | |
| 6,507,171 B2 | 1/2003 | Ruha et al. | |
| 6,605,925 B2 * | 8/2003 | Tange et al. | 320/134 |
| 6,614,205 B2 * | 9/2003 | Nakashimo | 320/134 |
| 7,253,589 B1 | 8/2007 | Potanin et al. | |
| 7,737,664 B2 * | 6/2010 | Matsunaga | 320/134 |
| 2002/0158654 A1 | 10/2002 | Graf | |
| 2004/0164786 A1 | 8/2004 | Yamamoto et al. | |
| 2006/0028192 A1 | 2/2006 | Ryu et al. | |
| 2007/0126476 A1 | 6/2007 | Nakashima | |

(Continued)

FOREIGN PATENT DOCUMENTS

JP 07-113826 A 5/1995

(Continued)

OTHER PUBLICATIONS

Japanese Office Action dated Apr. 20, 2010 and English translation thereof in counterpart Japanese Application No. 2008-149032.

(Continued)

*Primary Examiner* — Reena Aurora
(74) *Attorney, Agent, or Firm* — Holtz, Holtz, Goodman & Chick, PC (57) ABSTRACT

Disclosed is a charge-controlling semiconductor integrated circuit including: a current-controlling MOS transistor; a current detection circuit including a 1/N size current-detecting MOS transistor; and a gate voltage control circuit, wherein the current detection circuit includes an operational amplifier circuit, a bias condition of the current-detecting MOS transistor becomes same as the current-controlling MOS transistor based on an operational amplifier circuit output, voltage drops in lines from drain electrode to a corresponding input point of the operational amplifier circuit become the same by a parasitic resistance, and when the output of the operational amplifier circuit is applied to a control terminal of the bias condition controlling transistor, the drain voltages become the same potential, and the line from the drain electrode of the current-detecting MOS transistor to the input point is formed to be redundantly arranged inside the chip so that a parasitic resistance becomes a predetermined value.

6 Claims, 4 Drawing Sheets

U.S. PATENT DOCUMENTS

2008/0018387 A1   1/2008   Ryu et al.

FOREIGN PATENT DOCUMENTS

| | | |
|---|---|---|
| JP | 09-082893 A | 3/1997 |
| JP | 2000-284195 A | 10/2000 |
| JP | 2002-209340 A | 7/2002 |
| JP | 2004-259902 A | 9/2004 |
| JP | 2007-134624 A | 5/2007 |

OTHER PUBLICATIONS

Taniguchi, Kenji. "CMOS Anarogu Kairo Nyumon (Introduction to CMOS analog Circuit)". Japan: CQ Publishing Co., Ltd., 2006., $4^{th}$ edition, pp. 152-155. (and partial English translation thereof).

Extended European Search Report dated Nov. 11, 2009 (5 pages), issued in counterpart European Application No. 09161921.3.

* cited by examiner

CHARGE-CONTROLLING SEMICONDUCTOR INTEGRATED CIRCUIT

BACKGROUND OF THE INVENTION

1. Field of the Invention

The present invention relates to a power-controlling semiconductor integrated circuit which includes a current detection circuit and controls a power depending on detected current, and relates to, for example, an effective technique when being used in a charge-controlling IC (semiconductor integrated circuit) mounting a charge-controlling circuit.

2. Description of Related Art

A charging apparatus for a secondary battery uses an IC having a charge-controlling circuit to control a charging current with a charge-controlling transistor composed of a MOSFET (insulated gate field effect transistor; hereinafter referred to as MOS transistor) provided between an input terminal to which a direct voltage from an AD adapter is input and an output terminal to which the secondary battery is connected.

Conventionally, in such charge-controlling IC, current flowing through a current-controlling transistor is detected during a preliminary charge or rapid charge so that charging current is controlled to be constant. As a method for detecting charging current in such constant current mode, there has been known a method where a current-detecting sense resistance is connected in series with a current-controlling transistor so that current is detected based on a voltage drop amount in the resistance This method can detect current with a relatively-high degree of accuracy, but since current flowing through the sense resistance is large, there is a problem that a power loss in the sense resistance is large so that power efficiency lowers.

Consequently, there has been proposed a method where a transistor of smaller size than a current-controlling transistor is connected in parallel with the current-controlling transistor, a gate voltage same as that of the current-controlling transistor is applied to the smaller transistor to generate current which is scaled down to charging current in a current mirror to flow the generated current through the sense resistance so that current is detected based on a voltage drop amount in the resistance This method has an advantage that power efficiency is improved because the current flowing through the sense resistance is small, but there is a problem that since a bias condition of the current-detecting transistor is different from that of the current-controlling transistor due to load variation or the like, it is impossible to flow accurately scaled-down current, and a detection accuracy lowers.

On the other hand, there has been proposed an invention to improve current detection accuracy in driving/controlling of a power transistor by providing a current-detecting transistor current-mirror-connected to the power transistor, and a bias-controlling transistor connected in series with the current-detecting transistor, by providing a difference amplifier whose inputs are drain voltages of the power transistor and the current-detecting transistor, and whose output terminal is connected to a gate terminal of the bias-controlling transistor, so that a bias condition of the current-detecting transistor becomes same as that of an outputting transistor by an imaginary short function of the difference amplifier (Japanese Patent Application Laid-Open Publication No. 2004-259902).

The inventors of the present application have been tried to apply a current detection technique of current mirror system using an operation amplifier to the charge-controlling circuit. As a result, it becomes clear that though current detection with a relatively-high degree of accuracy can be performed when one of a plurality of cells is used for current detection in driving/controlling of a multi-cell type power MOSFET, there is a problem that in the case of a charge-controlling semiconductor integrated that the inventers intend to apply, where the current-controlling transistor and the control circuit thereof are formed on one semiconductor chip, variation in manufacturing processes misaligns a size ratio of the current-controlling transistor and the current-detecting transistor and a desired value so that current detection accuracy lowers.

SUMMARY OF THE INVENTION

The present invention is achieved in view of above problems, and an object of the present invention is, in a charge-controlling IC configured to detect current flowing through a current-controlling MOS transistor with a current mirror system to control the detected current to improve current detection accuracy even when a size ratio of transistors varies.

The other object of the present invention is, in a charge-controlling IC configured to detect current flowing through a current-controlling MOS transistor with a current mirror system to control the detected current, to reduce total system cost as well as to improve current detection accuracy.

In order to achieve the above object, according to a first aspect of the present invention, there is provided a charge-controlling semiconductor integrated circuit including: a current-controlling MOS transistor connected between a voltage input terminal and an output terminal, which current-controlling MOS transistor controls current flowing from the voltage input terminal to the output terminal; a current detection circuit including a current-detecting MOS transistor of 1/N size of the current-controlling MOS transistor, a source terminal of which current-detecting MOS transistor is connected to a source terminal of the current-controlling MOS transistor, and to a gate terminal of which current-detecting MOS transistor, gate voltage same as gate voltage of the current-controlling MOS transistor is applied; and a gate voltage control circuit to control the gate voltage of the current-controlling MOS transistor depending on a current value detected by the current detection circuit, wherein the current detection circuit includes an operational amplifier circuit to which drain voltage of the current-controlling MOS transistor and drain voltage of the current-detecting MOS transistor are input, the current detection circuit is configured so that a bias condition of the current-detecting MOS transistor becomes same as a bias condition of the current-controlling MOS transistor based on an output of the operational amplifier circuit, the current detection circuit is set so that voltage drops in lines from drain electrodes of the current-controlling MOS transistor and the current-detecting MOS transistor to a corresponding input point of the operational amplifier circuit become the same by a parasitic resistance, the current detection circuit includes a bias condition controlling transistor which is connected between the current-detecting MOS transistor and a current-voltage conversion member connected to a ground point, the current detection circuit is configured so that when the output of the operational amplifier circuit is applied to a control terminal of the bias condition controlling transistor, the drain voltages of the current-controlling MOS transistor and the current-detecting MOS transistor become the same potential, and the line from the drain electrode of the current-detecting MOS transistor to the input point of the operational amplifier circuit is formed to be redundantly arranged inside the chip so that a parasitic resistance becomes a predetermined value.

BRIEF DESCRIPTION OF THE DRAWINGS

The present invention will become more fully understood from the detailed description given hereinbelow and the appended drawings which are given by way of illustration only, and thus are not intended as a definition of the limits of the present invention, and wherein.

DETAILED DESCRIPTION OF THE INVENTION

In the following, the preferred embodiments of the present invention will be described with reference to the drawings.

Figure 1:
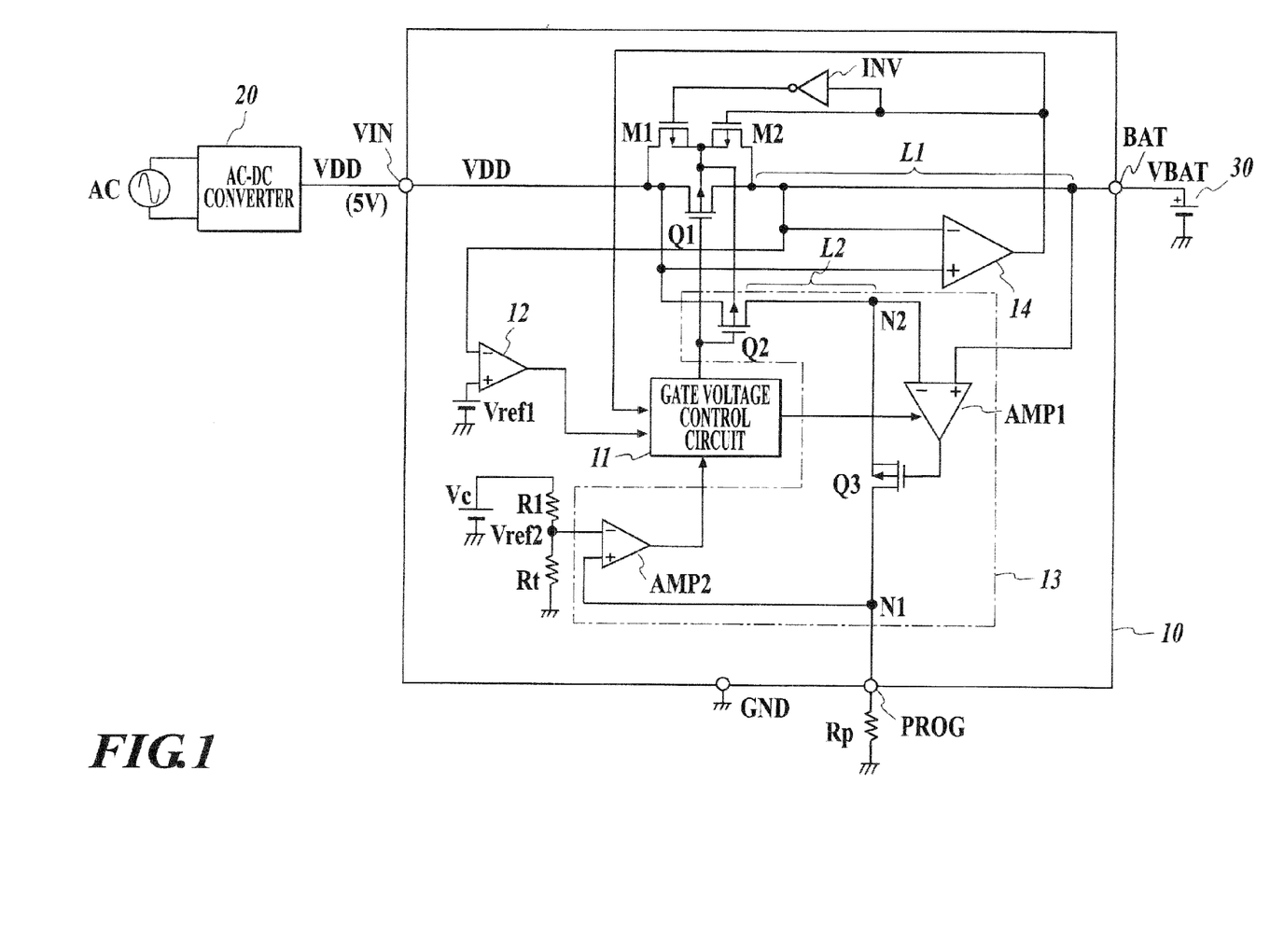
FIG. 1 is a configuration view schematically showing an example of a charge-controlling IC and a charging apparatus using the charge-controlling IC to which the present invention is applied.

FIG. 1 shows an embodiment of a charge-controlling IC of a secondary battery, and a schematic configuration of a charging apparatus using the charge-controlling IC, to which the present invention is applied.

As shown in FIG. 1, the charging apparatus according to the embodiment includes: an AC-DC converter 20 to convert an alternating voltage AC to a direct voltage of, for example, 5V; and a charge-controlling IC 10 to charge a secondary battery 30 such as a lithium ion battery by a direct voltage VDD converted by the AC-DC converter 20. The AC-DC converter 20 is equipped with a diode bridge circuit for rectification, and a DCDC converter which includes a transformer and performs switching drive by PWM or PFM method to a switching element connected to a primary-side coil of the transformer to generate desired direct voltage.

The charge-controlling IC 10 is equipped with a voltage input terminal VIN to which the direct voltage VDD from the AC-DC converter 20 is input, a battery terminal BAT as an output terminal to which the second battery 30 being subjected to a battery charge is connected, a current-controlling MOS transistor Q1 composed of a P-channel MOSFET provided between the voltage input terminal VIN and the battery terminal BAT, and a gate voltage control circuit 11 to generate a gate controlling voltage for the Q1.

The charge-controlling IC 10 also includes a voltage detection circuit 12 composed of an error amplifier which generates voltage according to a potential difference between voltage VBAT of the battery terminal BAT and reference voltage Vref1 to output the generated voltage to the gate voltage control circuit 11 for constant voltage control, and the like; and a current detection circuit 13 including a current-detecting MOS transistor Q2 whose gate width is 1/N size of the current-controlling MOS transistor Q1, whose source terminal is connected to the voltage input terminal VIN, and whose control terminal (gate terminal) is supplied with the same voltage as Q1, so as to constitute a current mirror circuit with Q1, and an error amplifier AMP2 which outputs voltage according to the detected current. In this embodiment, since a size ratio N of Q1 and Q2 is a value approximately within the range from several hundred to several thousand as described later, current flowing through the current-detecting MOS transistor Q2 becomes very small so that loss in an after-mentioned current-detecting resistance (Rp) can be reduced.

The gate voltage control circuit 11 performs control so that in a preliminary charge mode immediately after start of charge and a subsequent rapid charge mode, predetermined constant current flow through the current-controlling MOS transistor Q1 respectively according to the detected signals from the current detection circuit 13, though not limited to this configuration. Moreover, the gate voltage control circuit 11 controls the current-controlling MOS transistor Q1 by constant voltage control depending on the detected signal from the voltage detection circuit 12, for example until the second battery reaches about 4.2V by the rapid charge and then becomes full-charged state, so as to charge the battery.

Specifically, in the preliminary charge mode, the gate voltage control circuit 11 controls the gate voltage of Q1 so that relatively small current (constant current) of, for example 70 mA, flows through the current-controlling MOS transistor Q1. This preliminary charge is performed in order to recover battery voltage to about 3V in the case of the lithium ion battery, and since the battery easily deteriorates when the charging current is large, the charge is performed while suppressing the current and this mode ends at the time when the battery voltage is recovered to about 3V. In the case of the lithium ion battery, the preliminary charge is generally performed for about 20 minutes It is also possible to incorporate a timer to perform time control of the preliminary charge. In the rapid charge mode, the gate voltage control circuit 11 controls the gate voltage of Q1 so that relatively large charging current (constant current) of, for example 700 mA, flows through the current-controlling MOS transistor Q1.

In addition, the charge-controlling IC 10 of the embodiment includes: switch MOS transistors M1, M2 which is connected between a source or drain of the current-controlling MOS transistor Q1 and the substratum (backgate), and which selectively applies the input voltage VDD or the output voltage VBAT to the substratum of the Q1; and a voltage comparison circuit 14 to compare the input voltage VDD and the voltage VBAT of the battery terminal BAT to detect which of the voltages is higher.

An output of the voltage comparison circuit 14 is supplied to the gate voltage control circuit 11, and the gate voltage control circuit 11 is configured to turn the current-controlling MOS transistor Q1 to OFF state for preventing back flow when the voltage comparison circuit 14 detects that the output voltage VBAT becomes higher than the input voltage VDD. Moreover, the transistors M1, M2 are controlled to be an ON or OFF state complementarily depending on the output of the voltage comparison circuit 14.

Specifically, the voltage comparison circuit 14 compares the input voltage VDD and the output voltage VBAT, and since VDD is generally higher, the output of the voltage comparison circuit 14 becomes high level. As a result, the switch MOS transistor M1 for switching the backgate is turned on, and the switch MOS transistors M2 is turned off, so that the VDD is applied to the backgate of Q1. Thus, the current is prevented from flowing from the input terminal VIN to the battery terminal BAT through a parasitic diode of Q1.

If for any reason the input voltage VDD becomes below the output voltage VBAT, the output of the voltage comparison circuit 14 becomes low level, the switch MOS transistor M2 for switching the backgate is turned on, and the switch MOS transistors M1 is turned off, so that the VBAT is applied to the backgate of Q1. Thus, the current is prevented from flowing from the battery terminal BAT to the input terminal VIN through a parasitic diode of Q1.

Although there is also a method to connect a back flow preventing diode in series with Q1 in order to prevent the back flow between the input terminal and the output terminal, by this method, relatively large current flows though the diode so that loss becomes large. According the embodiment, the back flow can be prevented without providing the diode, by providing the voltage comparison circuit 14 and the MOS transistors M1, M2 for switching the substrate potential to turn off Q1 when the output voltage is higher so as to apply the output voltage to the backgate of Q1, and thereby the loss can be reduced.

Furthermore, in the embodiment, the current detection circuit 13 is designed to improve current detection accuracy The current detection circuit 13 will be described in detail below.

As shown in FIG. 1, in the current detection circuit 13 of the embodiment, a MOS transistor Q3 for controlling the bias condition is connected between a drain terminal of the current-detecting MOS transistor Q2 and an external terminal PROG for connection of an external resistance so as to be in series with Q2. In addition, there is provided an operation amplifier (operational amplifier circuit) AMP 1 whose inputs are drain voltage of the current-controlling MOS transistor Q1 and the drain voltage of Q2, and which is composed of a MOS transistor, and an output of the operation amplifier AMP1 is applied to a gate terminal of the MOS transistor Q3.

By this configuration, feedback occurs by an imaginary short function of the operation amplifier AMP1 so that the drain voltage of Q1 becomes same as the drain voltage of Q2, and thereby the bias conditions, namely the operation states of Q1 and Q2 become the same so that scaled down current exactly proportional to a size ratio of Q1 and Q2 flows through Q2. By flowing this current through the external resistance Rp connected between the external terminal PROG and a ground point, current detection accuracy is improved.

An potential of a connection node N1 which is current-voltage converted by the resistance Rp is amplified by the error amplifier AMP2 to a voltage proportional to a potential difference with a predetermined reference voltage Vref2 to be supplied to the gate voltage control circuit 11, and the gate control of the current-controlling MOS transistor Q1 is performed so that a current value becomes a predetermined value. Incidentally, the current detection circuit 13 may be configured to switch the reference voltage Vref2 to be supplied to the error amplifier AMP2 between voltage for the preliminary charge and voltage for the rapid charge to change the current value between current value at the time of the preliminary charge and current value at the time of the rapid charge.

Figure 2:
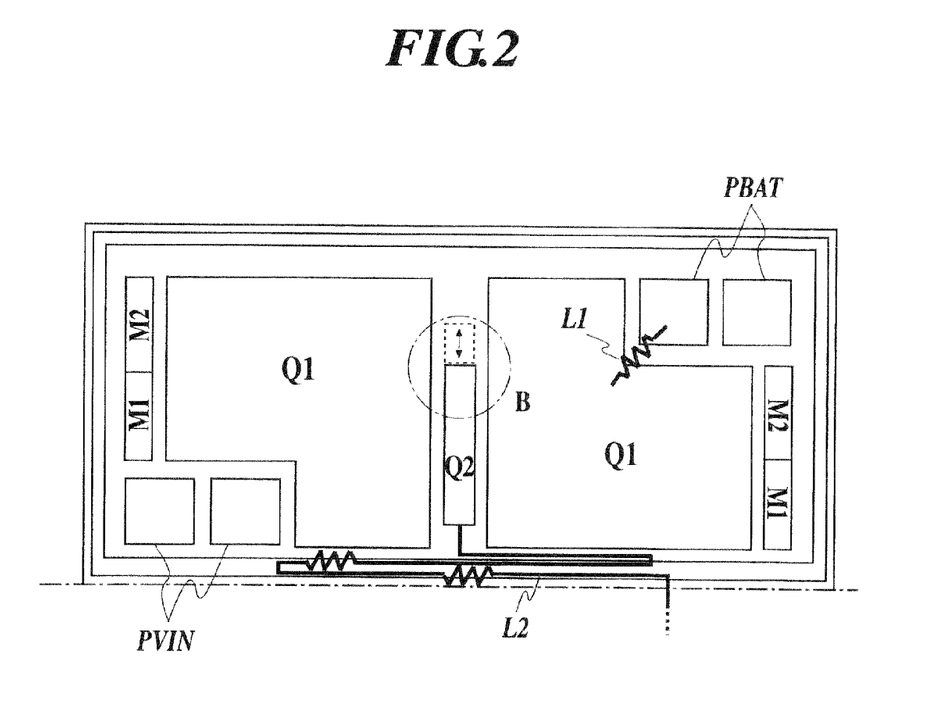
FIG. 2 is a plain view of a chip showing an example of a layout of a current-controlling transistor and a current-detecting MOS transistor in the charge-controlling IC of the embodiment.

Moreover, in the embodiment, a line L1 from the drain terminal (electrode) of the current-controlling MOS transistor Q1 to the output terminal BAT and a line L2 from the drain terminal (electrode) of the current-detecting MOS transistor Q2 to a node N2 to which an inverted input terminal of the operation amplifier AMP1 are set so that cross-section areas of lines L1 and L2 are same and a length ratio of L1 and L2 is 1:N, and thereby voltage drops in Q1 and Q2 due to the parasitic resistance of the drain lines become the same. Specifically, as shown in FIG. 2, by allowing the line L2 of Q2 to take a roundabout route to be redundantly arranged inside the chip, the length ratio of the line L1 and the line L2 becomes 1:N. As a result, the bias conditions of Q1 and Q2 become almost the same so that accuracy of the current mirror can be further improved.

In FIG. 2, reference number Q1 denotes a region where the current-controlling MOS transistor Q1 is formed, reference number Q2 denotes a region where the current-detecting MOS transistor Q2 is formed, and reference numbers M1, M2 denote a region where the switch MOS transistors M1, M2 for switching potential of the substratum of Q1. Moreover, reference number PVIN denotes a pad as the voltage input terminal VIN composed of metal layers, and reference number PBAT denotes a pad as the output terminal BAT composed of metal layers.

FIG. 2 shows a layout where the current-controlling MOS transistor Q1 is formed to be divided into two symmetrical parts, the current-detecting MOS transistor Q2 is formed in the center of the two parts, and the switch MOS transistors M1, M2 for switching potential of the substratum are formed at both right and left ends. In FIG. 2, M1 and M2 are formed as divided two parts, and lines are formed so that the right and left parts operate as one transistor. This layout is adopted in view of process variation In manufacturing process, static characteristics of a MOS transistor formed on a chip sometimes deviate from designed values due to a mask misalignment or process condition. In this case, since the size ratio (gate width ratio) of the current-controlling MOS transistor Q1 and the current-detecting MOS transistor Q2 is a value approximately within the range from several hundred to several thousand in the embodiment the deviation influences Q2 to a greater degree than Q1. For this reason, in the embodiment, as shown in FIG. 2, Q2 is provided roughly in the center of the region where Q1 is formed, and an effective gate width of Q2 can be adjusted by modifying an aluminum line pattern in a portion marked by a dashed line B.

Figure 3:
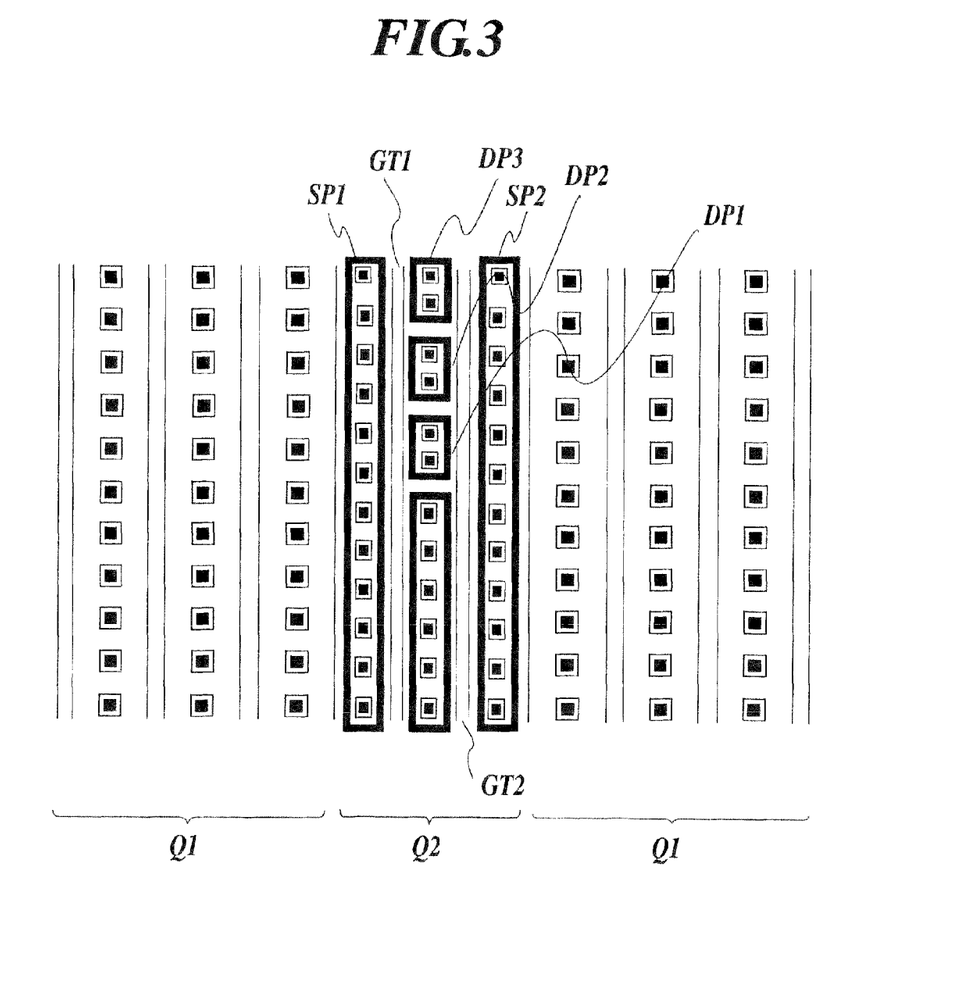
FIG. 3 is a plain view showing details of an adjustment region of the current-detecting MOS transistor.

Specifically, as shown in FIG. 3 where the portion marked by a dashed line B is enlarged, the embodiment provides extra electrodes DP1, DP2, DP3 and so on formed by separating the drain electrode in an end portion of Q2, corresponding to each gate unit. Then, when property deviation of Q2 is detected as a result of an experimental manufacture, the embodiment determines whether or not an aluminum line pattern for connecting between the extra electrodes DP1, DP2, DP3 and so on is to be provided depending on the deviation amount, and when it is determined that the line pattern is to be provided, the embodiment determines the number of the line pattern to adjust the effective gate width. Incidentally, a drain region composed of a diffusion layer, which is formed on a substrate surface under the extra electrodes DP1, DP2, DP3 and so on, may be formed continuously without being separated. In FIG. 3, reference numbers SP1, SP2 denote a source electrode of Q2, and GT1, GT2 denotes a gate electrode of Q2.

Figure 4:
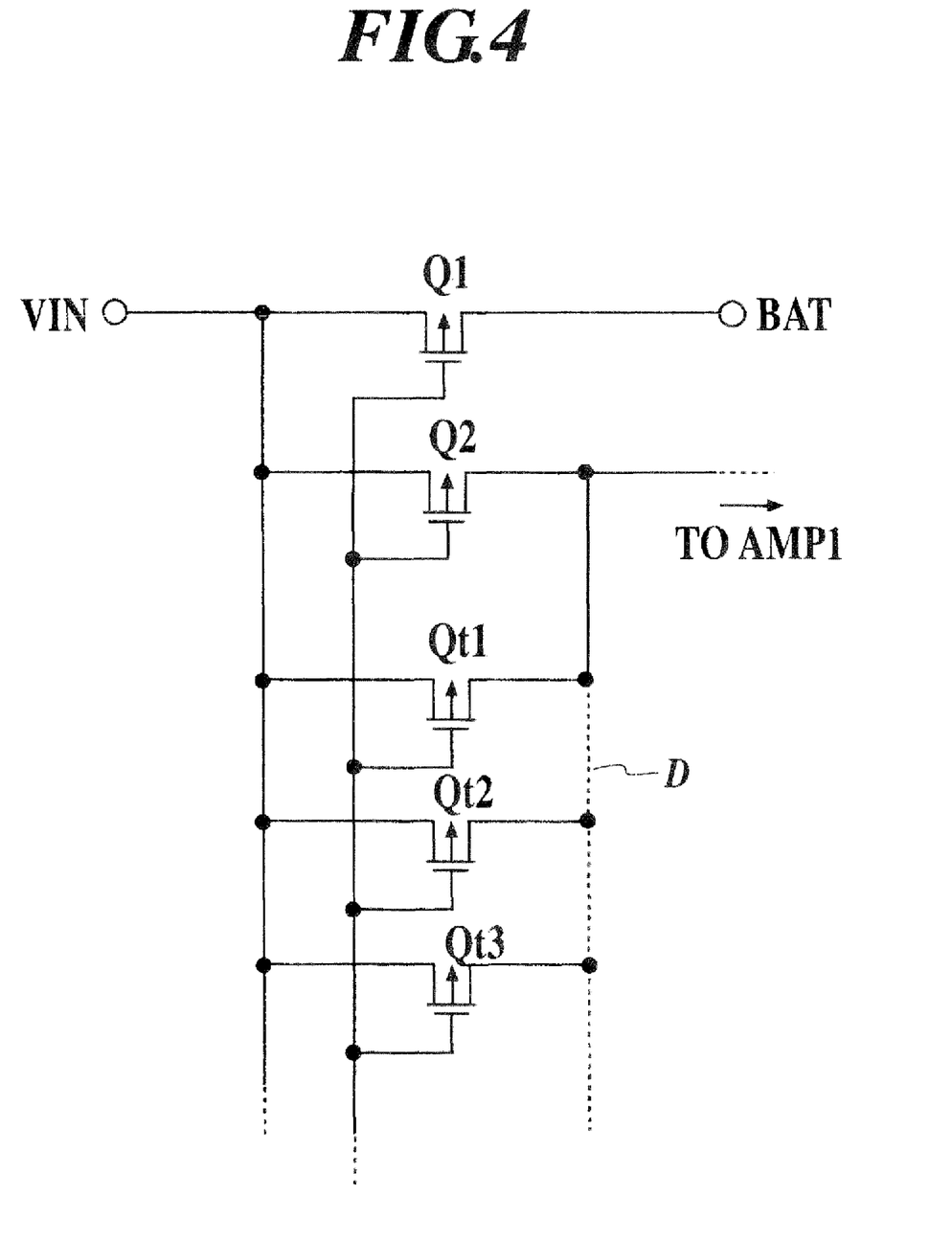
FIG. 4 is a circuit view showing equivalent circuits of the current-controlling MOS transistor and an adjustable gate width current-detecting MOS transistor.

As shown in FIG. 4, this adjustment corresponds to, in terms of circuit, previously providing adjustment transistors Qt1, Qt2, Qt3 and so on of smaller size than Q2 in parallel with Q2, properly connecting or cutting off Q2 and drain terminals of Qt1, Qt2, Qt3 and so on as shown with dashed line D to adjust the size (gate width) of Q2. By such adjustment, it becomes possible to correctly adjust the size ratio, namely current ratio of Q1 and Q2 to N:1.

Moreover, since the size of the current-detecting MOS transistor Q2 is adjusted in a stepwise (discrete) mariner, only digital adjustment is performed. For this reason, in order to enable finer adjustment, as shown in FIG. 1, the embodiment generates the reference voltage Vref2 to be supplied to the error amplifier AMP2 by dividing the constant voltage Vc with serial resistances R1, Rt, and configure the circuit so that the value of the resistance Pt can be changed by trimming. As a way of trimming the resistance Rt, there is a method for example where a plurality of resistances are previously provided in parallel with each other and fuses of polysilicon and the like are respectively provided in series with each of the resistance to perform adjustment by meltdown of the fuse.

As described above, according to the embodiment, by size adjustment of the current-detecting MOS transistor Q2 by selective connection of the extra drain electrode, and by adjustment of the reference voltage Vref2 of the error amplifier AMP2 by trimming of the dividing resistance Rt, the current ratio of Q1 and Q2 can be obtained with high accuracy in the embodiment.

Furthermore, the embodiment devises the following design of the current mirror ratio of Q1 and Q2 in order to reduce total cost of the system. Specifically, as shown in following Table 1, the current mirror ratio is selected depending of the resistance value of the external resistance Rp connected to the external terminal PROG.

TABLE 1

| Rp | CURRENT MIRROR RATIO |
|---|---|
| 1.0 kΩ | 350 |
| 2.2 kΩ | 770 |
| 4.7 kΩ | 1645 |

High-accuracy general-purpose resistances currently provided in the market do not have every resistance values, and as shown in Table 1, the resistances have discrete values such that 1.0 kΩ, 2.2 kΩ, 4.7 kΩ, and so on. These resistances can be obtained at a relatively low price, but resistance elements having other resistance values are special order items and their prices are high. For this reason, the embodiment determines the size ratio (gate width ratio) of Q1 and Q2 so that the current mirror ratios become 350, 770 and 1645 corresponding to the resistance value of the general-purpose resistances, 1.0 kΩ, 2.2 kΩ, 4.7 kΩ, and so on. By this configuration, the low-price general-purpose resistances can be used as the external resistance Rp so that the cost is reduced.

One of the embodiments of the present invention has been described as above, but the present invention is not limited to the above-described embodiment, and various changes can be added based on the technical idea of the present invention. For example, in the embodiment of FIG. 2, the line L1 from the drain terminal (electrode) of the current-controlling MOS transistor Q1 to the output terminal BAT, and the line L2 from the drain terminal (electrode) of the current-detecting MOS transistor Q2 to the inverted input terminal of the operational amplifier AMP1, are set so that their cross-section areas are same and the length ratio is 1:N, but it is also possible to adjust both of the cross-section areas and the length ratio so that the voltage drops in Q1 and Q2 due to the parasitic resistance becomes the same.

In addition, though the common connection side (input terminal VIN side) of the current-controlling MOS transistor Q1 and the current-detecting MOS transistor Q2 is the source terminal and the opposite side is the drain terminal in the above-described embodiment, it is also possible to regard the common connection side (input terminal VIN side) of Q1 and Q2 as the drain terminal, and to regard the opposite side as the source terminal. The present invention includes also such case.

Moreover, in the current detection circuit 13 of the embodiment of FIG. 1, the external resistance is used as the current-voltage conversion resistance Rp connected in series with the MOS transistor Q3, but also an on-chip resistance formed inside a chip may be used. In this case, the current mirror ratios of Q1 and Q2 are not limited to the correspondence relation shown in Table 1, and arbitrary ratios may be adopted.

Furthermore, in the above-described embodiment, MOSFET is used as the transistor Q3 for controlling the bias condition, but also a bipolar transistor may be used In this case, the bipolar transistor to be used may be a lateral transistor which can be formed in CMOS process, not a vertical transistor.

Although the example where the present invention is applied to the charge-controlling IC of the secondary battery has been described, the present invention is not limited to the example, and can be used in a power-controlling IC of a direct current power source circuit such as a series regulator.

According to the charge-controlling semiconductor integrated circuit of the present invention, there is provided a charge-controlling semiconductor integrated circuit including: a current-controlling MOS transistor connected between a voltage input terminal and an output terminal, which current-controlling MOS transistor controls current flowing from the voltage input terminal to the output terminal; a current detection circuit including a current-detecting MOS transistor of 1/N size of the current-controlling MOS transistor, a source terminal of which current-detecting MOS transistor is connected to a source terminal of the current-controlling MOS transistor, and to a gate terminal of which current-detecting MOS transistor, gate voltage same as gate voltage of the current-controlling MOS transistor is applied; and a gate voltage control circuit to control the gate voltage of the current-controlling MOS transistor depending on a current value detected by the current detection circuit, wherein the current detection circuit includes an operational amplifier circuit to which drain voltage of the current-controlling MOS transistor and drain voltage of the current-detecting MOS transistor are input, the current detection circuit is configured so that a bias condition of the current-detecting MOS transistor becomes same as a bias condition of the current-controlling MOS transistor based on an output of the operational amplifier circuit, the current detection circuit is set so that voltage drops in lines from drain electrodes of the current-controlling MOS transistor and the current-detecting MOS transistor to a corresponding input point of the operational amplifier circuit become the same by a parasitic resistance, the current detection circuit includes a bias condition controlling transistor which is connected between the current-detecting MOS transistor and a current-voltage conversion member connected to a ground point, the current detection circuit is configured so that when the output of the operational amplifier circuit is applied to a control terminal of the bias condition controlling transistor, the drain voltages of the current-controlling MOS transistor and the current-detecting MOS transistor become the same potential, and the line from the drain electrode of the current-detecting MOS transistor to the input point of the operational amplifier circuit is formed to be redundantly arranged inside the chip so that a parasitic resistance becomes a predetermined value.

According to this means, since the bias conditions of the current-controlling MOS transistor and the current-detecting MOS transistor become the same, the current flows with the high accuracy current ratio so that the current detection accuracy is improved. Moreover, by configuring the line from the drain electrode of the current-detecting MOS transistor to the input point of the operational amplifier circuit to be redundantly arranged inside the chip so that a parasitic resistance becomes a predetermined value, the voltage drops in the lines from the drain electrodes of the current-controlling MOS transistor and the current-detecting MOS transistor to each input point of the operational amplifier circuit due to the parasitic resistance can be set to the same value relatively easily.

Preferably, the current-detecting MOS transistor is placed on a semiconductor chip to be positioned roughly in the center of a region where the current-controlling MOS transistor is formed Thus, the characteristic deviation of the current-controlling MOS transistor due to a mask disalignment and the like can be reduced.

Preferably, the current-detecting MOS transistor includes a basic drain electrode and a plurality of preliminary drain electrodes separated from each other, and the current-detecting MOS transistor is configured so that an effective gate width is adjustable by selectively connecting the preliminary drain electrodes to the basic drain electrode by an aluminum line pattern. Thus, the size ratio accuracy of the current-controlling MOS transistor and the current-detecting MOS transistor can be improved.

Preferably, the current detection circuit includes: a dividing circuit to divide a predetermined constant voltage; and an amplifier circuit to output voltage depending on a potential difference between the voltage divided by the dividing circuit and the voltage converted by the current-voltage conversion member which converts current flowing through the current-controlling MOS transistor to voltage, to the gate voltage control circuit, wherein any of resistances included in the dividing circuit is configured so that a resistance value is adjustable. Thus, even when the current ratio of the current-controlling MOS transistor and the current-detecting MOS transistor deviates due to a process variation, the deviation can be corrected easily.

Preferably, the current-voltage conversion member is an external resistance element of the semiconductor chip, and the current-voltage conversion member is equipped with an external terminal for connecting the resistance element Since higher accuracy can be obtained by the external resistance element rather than the on-chip resistance, the current detection accuracy can be improved.

Preferably, the external resistance element is a general-purpose resistance element having a predetermined resistance value, and a size ratio N of the current-controlling MOS transistor and the current-detecting MOS transistor is determined depending on the resistance value of the general-purpose resistance element. Thus, it becomes possible to use the low-price external resistance, and thereby the total system cost can be reduced.

According to the present invention, in the charge-controlling IC which detects the current flowing through the current-controlling MOS transistor by the current mirror system to control the current, even when the transistor size ratio varies, the current detection accuracy can be improved. Furthermore, since the low-price and high-accuracy external resistance can be used, the advantage that the current detection accuracy is improved and the total system cost lowers can be obtained.

The entire disclosure of Japanese Patent Application No. 2008-149032 filed on Jun. 6, 2008, including specification, claims, drawings and abstract are incorporated herein by reference in its entirety.

What is claimed is:

1. A charge-controlling semiconductor integrated circuit comprising:
a current-controlling MOS transistor connected between a voltage input terminal and an output terminal, which current-controlling MOS transistor controls current flowing from the voltage input terminal to the output terminal;
a current detection circuit including a current-detecting MOS transistor of 1/N size of the current-controlling MOS transistor, a source terminal of which current-detecting MOS transistor is connected to a source terminal of the current-controlling MOS transistor, and to a gate terminal of which current-detecting MOS transistor, gate voltage same as gate voltage of the current-controlling MOS transistor is applied; and
a gate voltage control circuit to control the gate voltage of the current-controlling MOS transistor depending on a current value detected by the current detection circuit, wherein
the current detection circuit includes an operational amplifier circuit to which drain voltage of the current-controlling MOS transistor and drain voltage of the current-detecting MOS transistor are input,
the current detection circuit is configured so that a bias condition of the current-detecting MOS transistor becomes same as a bias condition of the current-controlling MOS transistor based on an output of the operational amplifier circuit,
the current detection circuit is set so that voltage drops in lines from drain electrodes of the current-controlling MOS transistor and the current-detecting MOS transistor to a corresponding input point of the operational amplifier circuit become the same by a parasitic resistance,
the current detection circuit includes a bias condition controlling transistor which is connected between the current-detecting MOS transistor and a current-voltage conversion member connected to a ground point,
the current detection circuit is configured so that when the output of the operational amplifier circuit is applied to a control terminal of the bias condition controlling transistor, the drain voltages of the current-controlling MOS transistor and the current-detecting MOS transistor become the same potential, and
the line from the drain electrode of the current-detecting MOS transistor to the input point of the operational amplifier circuit is formed to be redundantly arranged inside the chip so that a parasitic resistance becomes a predetermined value.

2. The charge-controlling semiconductor integrated circuit according to claim 1, wherein the current-detecting MOS transistor is placed on a semiconductor chip to be positioned roughly in the center of a region where the current-controlling MOS transistor is formed.

3. The charge-controlling semiconductor integrated circuit according to claim 1, wherein
the current-detecting MOS transistor includes a basic drain electrode and a plurality of preliminary drain electrodes separated from each other, and
the current-detecting MOS transistor is configured so that an effective gate width is adjustable by selectively connecting the preliminary drain electrodes to the basic drain electrode by an aluminum line pattern.

4. The charge-controlling semiconductor integrated circuit according to claim 1, wherein
the current detection circuit includes:
a dividing circuit to divide a predetermined constant voltage; and
an amplifier circuit to output voltage depending on a potential difference between the voltage divided by the dividing circuit and the voltage converted by the current-voltage conversion member which converts current flowing through the current-controlling MOS transistor to voltage, to the gate voltage control circuit, wherein
any of resistances included in the dividing circuit is configured so that a resistance value is adjustable.

5. The charge-controlling semiconductor integrated circuit according to claim 1, wherein
the current-voltage conversion member is an external resistance element of the semiconductor chip, and the current-voltage conversion member is equipped with an external terminal for connecting the resistance element.

6. The charge-controlling semiconductor integrated circuit according to claim 5, wherein the external resistance element is a general-purpose resistance element having a predetermined resistance value, and a size ratio N of the current-controlling MOS transistor and the current-detecting MOS transistor is determined depending on the resistance value of the general-purpose resistance element.

* * * * *